(12) United States Patent
Kaya

(10) Patent No.: US 7,193,469 B2
(45) Date of Patent: Mar. 20, 2007

(54) SYSTEM AND METHOD FOR TESTING GATE OXIDE OF AN AMPLIFIER

(75) Inventor: Cetin Kaya, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 130 days.

(21) Appl. No.: 11/123,686

(22) Filed: May 6, 2005

(65) Prior Publication Data
US 2006/0250188 A1    Nov. 9, 2006

(51) Int. Cl.
*H03F 3/16*    (2006.01)
(52) U.S. Cl. .................... 330/277; 324/769
(58) Field of Classification Search ............. 330/277; 324/765–769
See application file for complete search history.

(56) References Cited

U.S. PATENT DOCUMENTS

| | | | |
|---|---|---|---|
| 5,798,649 A | * | 8/1998 | Smayling et al. ........... 324/551 |
| 6,812,050 B1 | | 11/2004 | Ramappa |
| 2006/0076972 A1 | * | 4/2006 | Walker et al. .............. 324/769 |

* cited by examiner

*Primary Examiner*—Robert Pascal
*Assistant Examiner*—Hieu Nguyen
(74) *Attorney, Agent, or Firm*—W. James Brady III; Frederick J. Telecky Jr.

(57) ABSTRACT

An amplifier system and method is provided for performing gate oxide integrity (GOI) testing of a power output field effect transistor (FET) of the amplifier system. The amplifier system and method provide for integrated test circuitry that protect drive components during overvoltage stress of a gate of the power output FET, and disables and/or isolates drive devices associated with leakage paths from the gate during gate oxide leakage measurements.

19 Claims, 3 Drawing Sheets

SYSTEM AND METHOD FOR TESTING GATE OXIDE OF AN AMPLIFIER

TECHNICAL FIELD

The present invention relates generally to electrical circuits, and more particularly to system and method for testing gate oxide of an amplifier.

BACKGROUND

Gate oxide integrity (GOI) testing is a critical metric for the effective functioning of a transistor. GOI testing is typically performed in the factory prior to shipment by applying a high stress bias voltage across the gate and source of an output power transistor of the amplifier, and measuring the leakage current associated with biasing the power transistor. The leakage current needs to be below a certain performance specification to be acceptable for shipment. However, GOI testing becomes more difficult when testing power transistors in an amplifier design, since other components (e.g., drive circuitry) associated with normal operation of the amplifier need to be protected during gate oxide testing. This may include providing additional isolation components that can effect the operation of the amplifier during normal operation.

For example, Class D audio amplifiers employ power transistors that are subject to gate oxide testing to meet acceptable DPPM (defects parts per million) specifications. Class D audio amplifiers are switching amplifiers that employ drive circuitry that switches between providing high supply voltage and a low supply voltage to the gate of a power transistor. If the power transistors are cascaded, a dedicated drive circuit may be employed for each power transistor. Additional power transistors and dedicated drive circuits may be employed for multiple channel devices. One technique for isolating a power transistor in an amplifier design for gate oxide integrity testing is to insert a diode between the final pull-up and pull-down of the gate driver. Another approach, is to couple the source terminal of the power transistor to a different pad for current measurements of the gate oxide. However, these techniques are not viable in a multi-channel class D audio amplifier due to the fact that the insertion of a diode in the pull-up path affects timing of the amplifier, and the limited bonding availability for independent paths due to area of the amplifier and pin count constraints.

SUMMARY

In accordance with an aspect of the present invention, an amplifier system is provided comprising a power output Field Effect Transistor (FET), a driver having a gate drive terminal coupled to a gate of the power output FET for switching of the power output FET between an "ON" state and an "OFF" state, and a probe pin coupled to the gate drive terminal for providing a probe voltage to the gate of the power output FET during gate oxide integrity (GOI) test leakage measurements of the power output FET. The amplifier system further comprises a gate oxide integrity (GOI) force pin coupled to an internal node of the driver, wherein a leakage test voltage applied to the GOI force pin disables devices of the driver that cause leakage paths from the gate drive terminal during a GOI test leakage measurement of the power output FET.

In accordance with another aspect of the invention, an amplifier system is provided having a driver for driving a power field effect transistor (FET) of the amplifier system. The driver includes a driver output stage that comprises a pull down transistor coupled between a gate drive terminal and a source drive terminal and a pull up transistor coupled between a gate drive supply voltage and the gate drive terminal. The amplifier system further includes a first input drive transistor for receiving a first differential input signal and a second input drive transistor for receiving a second differential input signal. The state of the first differential input signal determines which one of the pull up and pull down transistors are "ON" and which one of the pull up and pull down transistors are "OFF during normal operation. The driver output stage further comprises an output resistor coupled in series with an isolation transistor. The output resistor and the isolation transistor are coupled between the gate drive terminal and the source drive terminal. A gate oxide integrity (GOI) force pin is coupled to the gate of the isolation transistor, wherein a leakage test voltage applied to the GOI force pin turns off the isolation transistor eliminating the leakage path from the gate drive terminal associated with the output resistor during a GOI test leakage measurement of a power output FET coupled to the driver output stage.

In accordance with yet another aspect of the present invention, a method is provided for performing gate oxide integrity (GOI) test on a power output field effect transistor (FET) coupled to a driver of an amplifier system. The method comprises applying an overvoltage stress voltage via a gate drive supply to a gate drive terminal coupled to a gate of the power output FET, reducing the gate drive supply to a nominal voltage, and applying a voltage higher than a probe voltage and the nominal voltage to a GOI force pin to drive devices of the driver off that provide leakage paths from the gate drive terminal. The method further comprises applying the probe voltage to the gate drive terminal through a probe pin, and measuring the leakage current associated with the gate of the power output FET.

BRIEF DESCRIPTION OF THE DRAWINGS

The foregoing and other aspects of the present invention will become apparent to those skilled in the art to which the present invention relates upon reading the following description with reference to the accompanying drawings.

DETAILED DESCRIPTION

An amplifier system and method is provided for performing gate oxide integrity (GOI) testing of a power output field effect transistor (FET) of the amplifier system. The amplifier system and method provide for integrated test circuitry that protect drive components during overvoltage stress of a gate of the power output FET, and disables and/or isolates drive devices associated with leakage paths from the gate during gate oxide leakage measurements.

Figure 1:
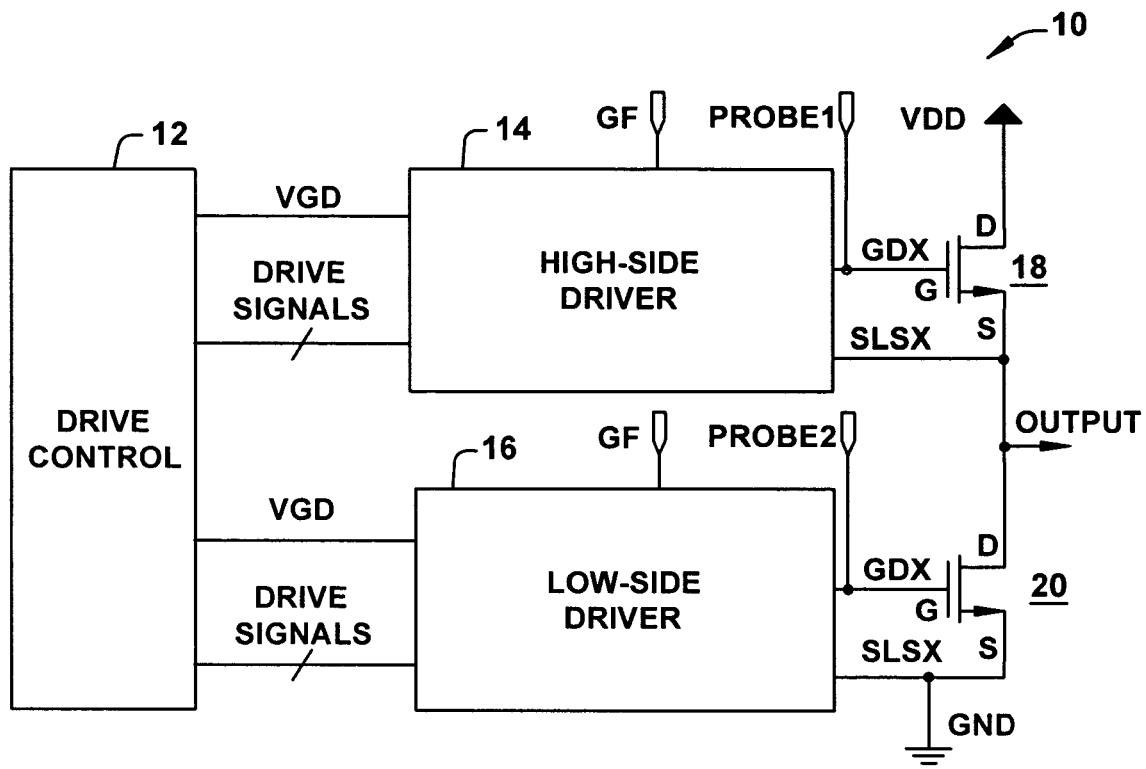
FIG. 1 illustrates an amplifier system in accordance with an aspect of the present invention.

FIG. 1 illustrates an amplifier system 10 with integrated test circuitry in accordance with an aspect of the invention. The amplifier system 10 can be a switching amplifier, such as a Class D audio amplifier. The integrated test circuitry provides protection of drive components during gate oxide testing of power output field effect transistors (FETs) of the amplifier system. The integrated test circuitry also allows for disabling or isolation of drive circuitry that provides leakage paths during gate oxide protection testing of power output field effect transistors (FETs) of the amplifier system 10. The integrated test circuitry resides in an output stage of both a high-side driver 14 and a low-side driver 16 and protects drive components of the respective output stage of the respective driver during overvoltage stressing of the power output FETs, and eliminates leakage paths from a gate drive terminal during leakage measurements.

A gate oxide integrity (GOI) force supply in conjunction with a GOI force pin coupled to drive protection components cooperate to reduce voltage across drive components during overvoltage stressing of a gate terminal of the power FET by applying an overvoltage test voltage to the GOI force pin. Additionally, the GOI force supply in conjunction with the GOI force pin are operative to isolate or disable the drive components coupled the gate of the power FET during gate oxide leakage measurements by applying a leakage test voltage to the GOI test pin. A probe supply and ammeter can be employed to apply a probe voltage and measure the leakage of the gate oxide of the power FET. The integrated test circuitry allows for gate oxide integrity testing without affecting the speed of the amplifier system, and with minimal bond pad connections.

The amplifier system 10 includes a drive control 12 that provides pulse waveform drive signals and supply signals (VGD) to both the high-side driver 14 and the low side driver 16. The high side driver 14 and the low-side driver 16 can include a plurality of drive stages. The output stage of the high side driver 14 drives a high-side power output FET 18, and the output stage of the low side driver 16 drives a low-side power output FET 20. The pulse waveform drive signals provide differential input signals in opposing "ON" and "OFF" states to both the high side driver 14 and the low side driver 16, such that the high side power output FET 18 is "OFF" when the low side power output FET 20 is "ON" and the LOW side power output FET 20 is "OFF" when the high side power output FET 18 is "ON". This toggles an output terminal (OUTPUT) between a supply voltage (VDD) and a ground (GND). The drive control 12 also assures that an appropriate guard band is provided so that the high side power output FET 18 and the Low side power output FET 20 are not "ON" at the same time causing the supply voltage to be shorted to ground.

The output stage of the high side driver 14 and low side driver 16 include low voltage latch devices that facilitate the pulling up and pulling down of the drive signals that turn the high side power output FET 18 and the low side power output FET 20 "ON" and "OFF". Protection devices are coupled to the low voltage latch devices to protect the low voltage latch devices during overvoltage stress. The low voltage latch devices are employed to achieve lower propagation delay to reduce cross coupling induced noise. A GOI force pin is coupled to a node of the protection devices to facilitate protection of the latch devices during overvoltage stress and to isolate and disable the devices from the gate of the power FETS during leakage measurements. An additional isolation device is provided between the gate and source of the power FET, so that the GOI force pin can also be employed to isolate a pull down resistor from the gate of the power FET during leakage measurements.

In this manner, the protection devices and the isolation device in cooperation with the GOI force pin allow for gate oxide integrity testing of the power FETs 18 and 20 without affecting the operation of the amplifier system 10 in addition to minimizing the pin count associated with providing external stimulus and measurement bond pads for performing GOI testing. The gate drive supply pin (VGD) can be employed for providing both overvoltage stress and bias voltage during leakage measurement of the power FETs 18 and 20. The GOI force pin can be coupled to nodes of both the high side driver 14 and the low side driver 16 with a separate probe pin (PROBE1) for the high side power output FET 18 and a separate probe pin (PROBE2) for the low side power output FET 20. The high side power output FET 18 and the low side power output FET 20 can be tested individually using the GOI force pin and dedicated probe pin.

Although the example of FIG. 1 is illustrated with respect to a single channel of an amplifier system, it is to be appreciated that the amplifier system 10 can include multiple channels. A single GOI force pin can be coupled to the internal nodes of each respective high side driver and low side driver with dedicated probe pins for each high side driver and low side driver. Therefore, with each additional amplifier channel, only two additional probe pins are needed to test each power FET of a multi-channel amplifier system.

Figure 2:
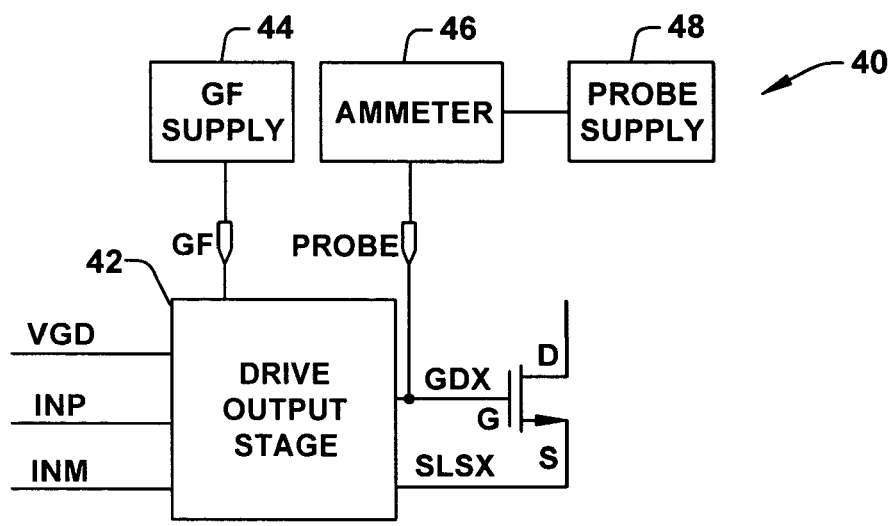
FIG. 2 illustrates a test setup for GOI testing in accordance with an aspect of the present invention.

FIG. 2 illustrates a test setup 40 for testing a power FET 50 of an amplifier system in accordance with an aspect of the present invention. The test setup 40 includes a GOI force supply 44, an ammeter 46 and a probe supply 48. The GOI force supply 44 is coupled to a GOI force pin of a drive output stage 42, and the probe supply 48 is coupled to a probe pin of the drive output stage 42 through the ammeter 46. The GOI force pin is coupled to an internal node of the drive output stage 42. The drive output stage 42 is provided a drive supply voltage (VGD), a first differential input (INP), and a second differential input (INM). The drive output stage 42 includes a gate drive terminal (GDX) coupled to a gate of a power output FET 50 and a source terminal (SLSX) coupled to a source of the power output FET 50. The drain of the power output FET 50 is coupled to a supply voltage if the power output FET 50 is a high-side power output FET and an output terminal if the power output FET 50 is a low-side power output FET.

The GOI force pin has a first state during normal operation, which is floating, a second state during overvoltage stress, which lowers the voltage on a latch device associated with the drive output stage 42 by applying an overvoltage test voltage to the GOI force pin, and a third state during leakage measurements, which disables devices coupled to the gate drive terminal (GDX) eliminating leakage paths from the gate drive terminal (GDX) by applying a leakage test voltage to the GOI force pin. The leakage paths can be eliminated by applying a voltage to drive components that is higher than the drive supply voltage (VGD) and higher than the probe voltage (PROBE) during leakage measurements, thus maintaining the drive components in an "OFF" state and/or isolating these drive components from the gate driver terminal. Thus, by eliminating leakage paths from the gate drive terminal (GDX), the leakage measured by the ammeter 46 is only associated with the gate oxide leakage of the power output FET 50.

For example, during a gate oxide integrity test, the INP pin is set to an "ON" state (e.g., about 5 volts), while the INM pin is set to an "OFF" state (e.g., 0 volts). The GOI force pin is set to an overvoltage test voltage (e.g., about 5 volts) to reduce the voltage across the latch device during overvoltage stress. The gate drive supply voltage (VGD) is set to an overvoltage stress voltage (e.g., about 20 volts) for about 10 ms applying an overvoltage bias stress voltage across the gate and source of the power output FET 50. The gate drive supply voltage is then reduced to an operation voltage (e.g., about 12 volts) and the GOI force pin is set to a leakage test voltage (e.g., about 13.5 volts) that is above the gate drive supply voltage (VGD) and a probe voltage (PROBE) to disable and/or isolate devices coupled to the gate drive terminal (GDX) eliminating leakage paths associated with the gate drive terminal. A probe voltage (e.g., 12 volts) is applied to the gate drive terminal (GDX) to bias the gate and source of the power output FET 50. The gate oxide leakage current can then be read from the ammeter 46.

Figure 3:
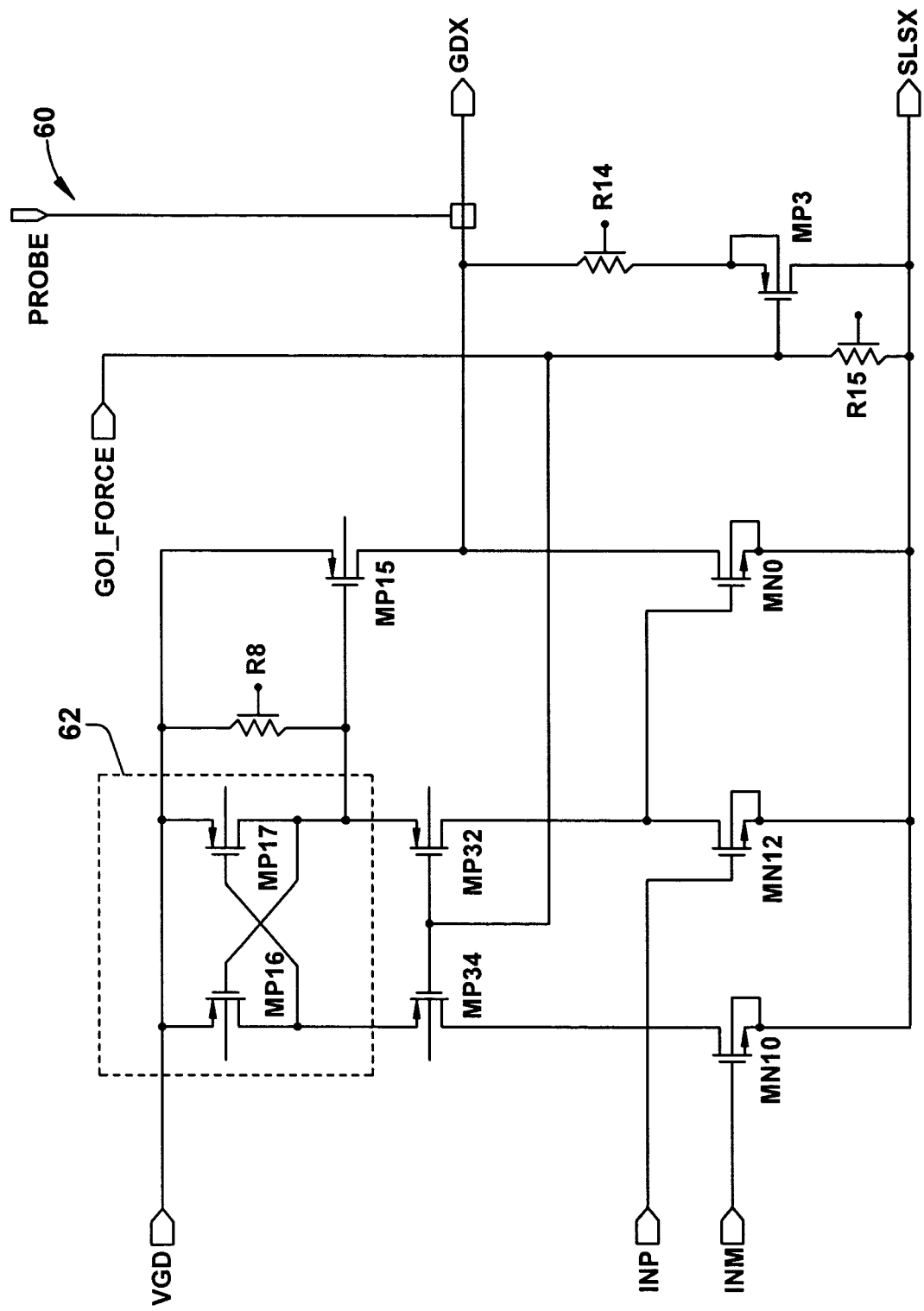
FIG. 3 illustrates a driver output stage in accordance with an aspect of the present invention.

FIG. 3 illustrates a drive output stage 60 in accordance with an aspect of the present invention. The drive output stage 60 includes a first n-type drive FET MN12 coupled to a first differential input pin (INP) and a second n-type drive FET MN10 coupled to a second differential input pin (INM). The first n-type drive FET MN12 has its drain coupled to a first p-type FET MP17 of a latch device 62 through a first p-type cascode FET MP32, and the second n-type drive FET MN10 is coupled to a second p-type FET MP16 of the latch device 62 through a second p-type cascode FET MP34. The first p-type FET MP17 and the second p-type FET MP16 of the latch device 62 are coupled to a gate drive supply voltage (VGD) and are lower voltage devices that facilitate the switching speed for pulling up and down a p-type pull up FET MP15 and a n-type pull down FET MNO. The first p-type FET MP17 and the second p-type FET MP16 are lower voltage devices than the p-type pull up FET MP15 and the n-type pull down FET MNO, and are employed to achieve lower propagation delay to reduce cross coupling induced noise. The first p-type cascode p-type FET MP32 and the second p-type cascode FET MP34 have gates coupled to a GOI force pin. The first p-type cascode p-type FET MP32, the second p-type cascode FET MP34 and the GOI force pin cooperate to mitigate the voltage across the first and second p-type FETs MP17 and MP16 of the latch device 62 during overvoltage stress by applying an overvoltage test voltage to the GOI force pin.

A gate of the p-type pull up FET MP15 is coupled between the first p-type FET MP17 of the latch device 62 and the first p-type cascode FET MP32. A resistor R8 is coupled between the gate drive supply voltage (VGD) and the gate of the p-type pull up FET MP15. The p-type pull up FET MP15 is coupled to the gate drive supply voltage (VGD) at its source and a gate drive terminal (GDX) at its drain. The n-type pull down FET MNO is coupled to a source drive terminal (SLSX) at its source and to the gate drive terminal (GDX) at its drain. The source drive terminal (SLSX) can be grounded during GOI testing. A resistor R15 is coupled between the GOI force pin and the source drive terminal (SLSX) for pulling the GOI force pin to ground during normal operation. A pull-down resistor R14 is coupled between the gate drive terminal (GDX) and a source of an isolation p-type FET MP3. The drain of the isolation p-type FET MP3 is coupled to the source drive terminal (SLSX). The isolation p-type FET MP3 is employed to isolate the pull-down resistor R14 during leakage measurements. The addition of the cascode FETs MP32 and MP34, the isolation FET MP3, and the resistor R15 to the drive output stage 60 facilitate GOI testing without loss of operation speed during normal operation and without the use of undue test pins. Additionally, the cascode FETs MP32 and MP34 allows for use of higher speed lower voltage devices MP16 and MP17 for facilitating pull up and pull down switching of the driver output stage 60.

During GOI testing, INP is set to about 5 volts turning MN12 "ON", while INM is set to about 0 volts turning MN10 "OFF". The GOI force pin is set to about 5 volts. This turns "ON" MP32 and MP34 causing the p-type pull FET MP15 to be turned "ON". A high overvoltage stress voltage of about 20 volts is applied for about 10 ms to the gate drive supply (VGD) causing about 20 volts to be applied to the gate drive terminal (GDX). The cascode FETS MP34 and MP32 also reduce the voltage across the p-type FETs MP16 and MP17, respectively, of the latch device 60, since the gate of the pull up FET MP15 is raised above 5 volts. The isolation FET MP3 is "ON" since the gate is at about 5 volts and the source is at about 20 volts.

During leakage measurement, the gate drive supply voltage (VGD) is reduced to about 12 volts, while the GOI force pin is raised to about 13.5 volts. This causes the p-type cascode devices MP34 and MP32 to turn "OFF", thus turning "OFF" the p-type pull up FET MP15. A probe voltage of about 12 volts is applied through an ammeter to a probe pin (PROBE) coupled to the gate drive terminal (GDX). Since the gate of p-type isolation FET MP3 is at about 13.5 volts and the source is at about 12 volts, the p-type isolation FET MP3 is also "OFF" eliminating the leakage path from the resistor R14 to ground. As a result, all of the possible leakage paths from the gate drive terminal (GDX) are eliminated, and the current through the ammeter is a measure of the leakage current through a gate of an output power FET coupled to the gate drive terminal (GDX).

Figure 4:
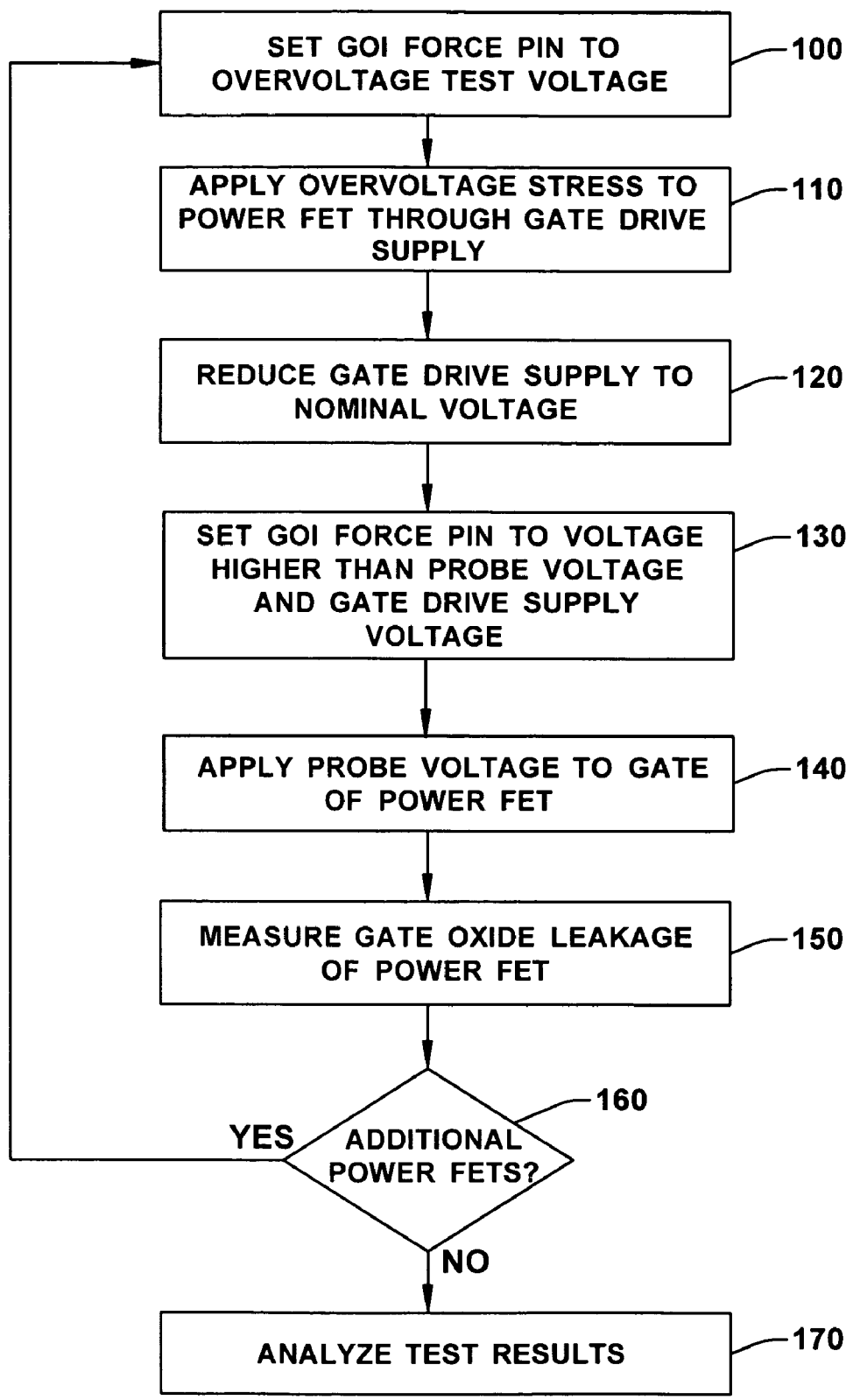
FIG. 4 illustrates a methodology for performing GOI testing on an amplifier system in accordance with an aspect of the present invention.

In view of the foregoing structural and functional features described above, a methodology in accordance with various aspects of the present invention will be better appreciated with reference to FIG. 4. While, for purposes of simplicity of explanation, the methodology of FIG. 4 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect the present invention.

FIG. 4 illustrates a methodology for performing a GOI test of an amplifier system in accordance with an aspect of the present invention. The methodology begins at 100 where a GOI force pin is set to an overvoltage test voltage (e.g., about 5 volts) to reduce the voltage across drive components of a latch device associated with an output stage of a driver of the amplifier system during overvoltage stress. The GOI force pin is coupled to an internal node of the output stage. The internal node is coupled to protection FETS that protect the drive components of the latch device during overvoltage stress and disable the leakage paths from the gate drive terminal during leakage measurements. At 110, an overvoltage bias stress voltage (e.g., about 20 volts) is applied for about 10 ms to a gate of a power output FET through a gate drive supply voltage. At 120, the gate drive supply voltage is reduced to a nominal voltage (e.g., about 12 volts). At 130, the GOI force pin is set to leakage test voltage (e.g., about 13.5 volts) that is higher than the probe voltage and the gate drive supply voltage. This disables and/or isolates devices associated with leakage paths from the gate drive terminal coupled to the gate of the power output FET. At 140, a probe voltage (e.g., about 12 volts) is applied to the gate of the power output FET. At 150, the gate oxide leakage of the output power FET is measured, for example, through an ammeter coupled between the probe voltage and the gate drive terminal. The methodology then proceeds to 160.

At 160, the methodology determines if additional power output FETs of the amplifier system are to be tested. For example, the power output FET can be a high-side power output FET. The additional power output FET can a low-side power output FET coupled to the high-side power output FET. Additionally, the amplifier system can include a plurality of channels with associated high-side and low-side power FETs. A single GOI force pin can be coupled to internal nodes of associated drivers of each power output FET, while a dedicated probe pin can be coupled to associated gates of each power output FET to facilitate GOI testing of each power output FET associated with the amplifier system. If the methodology determines that there are not any additional power output FETs to test (NO) at 160, the methodology proceeds to 170 to analyze the test results. If the methodology determines that there are additional power output FETs to test (YES) at 160, the methodology returns to 100 to repeat the test for the next power output FET.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the spirit and scope of the appended claims.

What is claimed is:

1. An amplifier system comprising:
   a power output Field Effect Transistor (FET);
   a driver having a gate drive terminal coupled to a gate of the power output FET for switching of the power output FET between an "ON" state and an "OFF" state;
   a probe pin coupled to the gate drive terminal for providing a probe voltage to the gate of the power output FET during gate oxide integrity (GOI) test leakage measurements of the power output FET; and
   a gate oxide integrity (GOI) force pin coupled to an internal node of the driver, wherein a leakage test voltage applied to the GOI force pin disables devices of the driver that cause leakage paths from the gate drive terminal during a GOI test leakage measurement of the power output FET.

2. The system of claim 1, further comprising a gate driver supply voltage coupled to the gate driver terminal through a pull up device of the driver, wherein the gate driver supply voltage is employed to apply and overvoltage stress voltage to the gate of the power output FET through the pull up device during GOI overvoltage stress, which is performed prior to the gate oxide GOI test leakage measurement.

3. The system of claim 2, wherein the driver further comprises:
   drive components that form a latch device that facilitates switching of the power output FET; and
   cascode protection devices coupled to the drive components of the latch device, the GOI force pin being coupled to the cascode protection devices, wherein an overvoltage test voltage applied to the GOI force pin in cooperation with the cascode protection devices provide protection to the drive components of the latch device during overvoltage stress by reducing the voltage across the drive components of the latch device.

4. The system of claim 3, wherein at least one of the cascode protection devices disables a leakage path associated with the pull up device upon application of the leakage test voltage applied to the GOI force pin.

5. The system of claim 3, wherein the drive components of the latch device are lower voltage devices than the pull up device and a pull down device associated with switching states of the gate drive terminal.

6. The system of claim 1, further comprising;
   an output resistor coupled between the gate drive terminal and a source drive terminal of the driver; and
   an isolation device coupled to the output resistor and the GOI force pin, the isolation device disabling a leakage path associated with the output resistor upon application of the leakage test voltage applied to the GOI force pin.

7. The system of claim 1, further comprising a pull down resistor coupled to the GOI force pin and a source driver terminal of the driver.

8. The system of claim 1, further comprising a plurality of power output FETs and associated drivers, wherein the GOI force pin is coupled to an internal node of each of the associated drivers, and a dedicated probe pin is coupled to a gate drive terminal of a respective driver, such that a leakage test voltage applied to the GOI force pin disables devices of a selected driver that cause leakage paths from the gate drive terminal during GOI test leakage measurements of a selected power output FET and a selected probe pin provides a bias voltage to the selected power output FET during GOI test leakage measurements of the selected power output FET.

9. The system of claim 1 being a class D amplifier.

10. An amplifier system having a driver for driving a power field effect transistor (FET) of the amplifier system, the driver having a driver output stage comprising:
    a pull down transistor coupled between a gate drive terminal and a source drive terminal;
    a pull up transistor coupled between a gate drive supply voltage and the gate drive terminal;
    an first input drive transistor for receiving a first differential input signal, the state of the first differential input signal determining which one of the pull up and pull down transistors are "ON" and which one of the pull up and pull down transistors are "OFF during normal operation;
    a second input drive transistor for receiving a second differential input signal;
    an output resistor coupled in series with an isolation transistor, the output resistor and the isolation transistor being coupled between the gate drive terminal and the source drive terminal; and
    a gate oxide integrity (GOI) force pin coupled to the gate of the isolation transistor, wherein a leakage test voltage applied to the GOI force pin turns off the isolation transistor eliminating the leakage path from the gate drive terminal associated with the output resistor during a GOI test leakage measurement of a power output FET coupled to the driver output stage.

11. The driver output stage of claim 10, further comprising:
    a latch device comprised of first and second latch transistors coupled to the gate drive supply terminal;
    a pair of first and second cascode transistors coupled between the first and second input drive transistors and the first and second latch transistors, respectively; and
    wherein the GOI force pin is coupled to gates of the first and second cascode transistors, such that the first and second cascode transistors protect the first and second latch transistors from an overvoltage stress voltage applied to the gate drive terminal during a GOI test by applying an overvoltage test voltage to the GOI force pin that reduces the voltage across the first and second latch transistors caused by the overvoltage stress voltage.

12. The driver output stage of claim 10, further comprising:
a cascode transistor coupled between the first input drive transistor and a gate of the pull up transistor wherein the GOI force pin is coupled to a gate of the cascode transistor, such that the leakage test voltage applied to the cascode transistor turns off the pull up transistor eliminating a leakage path from the gate drive terminal through the pull up transistor during a GOI test leakage measurement of a gate drive of the power output FET.

13. The driver output stage of claim 12, wherein the first differential input signal is set to turn on the first input drive transistor during a GOI test leakage measurement causing the pull down transistor to be off eliminating a leakage path from the gate oxide terminal through the pull down transistor during a GOI test leakage measurement of a gate oxide of a power output FET coupled to the driver output stage.

14. The driver output stage of claim 10, further comprising a pull down resistor coupled to the GOI force pin and the source driver terminal of the driver, wherein the GOI force pin is floated during normal operation.

15. The driver output stage of claim 10, further comprising a probe pin coupled to the gate drive terminal for providing a probe voltage to the gate of the power output FET during GOI test leakage measurements of the power output FET.

16. A method for performing gate oxide integrity (GOI) test on a power output field effect transistor (FET) coupled to a driver of an amplifier system, the method comprising:
applying an overvoltage stress voltage via a gate drive supply to a gate drive terminal coupled to a gate of the power output FET;
reducing the gate drive supply to a nominal voltage;
applying a voltage higher than a probe voltage and the nominal voltage to a GOI force pin to drive devices of the driver off that provide leakage paths from the gate drive terminal;
applying the probe voltage to the gate drive terminal through a probe pin; and
measuring the leakage current associated with the gate of the power output FET.

17. The method of claim 16, further comprising applying an overvoltage test voltage to the GOI force pin to protect devices from the applying of the overvoltage stress.

18. The method of claim 16, further comprising coupling an ammeter between the probe pin and a probe supply and coupling a GOI force supply to the GOI force pin.

19. The method of claim 16, further comprising repeating the GOI test of claim 16 for each of a plurality of power output FETs associated with the amplifier system.

* * * * *